United States Patent
Yanagida

(10) Patent No.: US 7,078,820 B2
(45) Date of Patent: Jul. 18, 2006

(54) SEMICONDUCTOR APPARATUS AND PROCESS OF PRODUCTION THEREOF

(75) Inventor: Toshiharu Yanagida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/915,160

(22) Filed: Jul. 25, 2001

(65) Prior Publication Data

US 2001/0042923 A1  Nov. 22, 2001

Related U.S. Application Data

(62) Division of application No. 09/385,959, filed on Aug. 30, 1999.

(30) Foreign Application Priority Data

Sep. 1, 1998 (JP) ............... P10-247393
May 26, 1999 (JP) ............... P11-146942

(51) Int. Cl.
*H01L 29/40* (2006.01)

(52) U.S. Cl. ............ 257/779; 257/772; 257/741; 257/780; 257/781; 257/783; 257/738; 257/737; 257/693

(58) Field of Classification Search ........ 257/779, 257/780, 781, 772, 741, 783, 738, 737, 693; 438/612, 108, 650, 680

See application file for complete search history.

(56) References Cited

U.S. PATENT DOCUMENTS

| | | | | |
|---|---|---|---|---|
| 3,811,183 A | * | 5/1974 | Celling ................. | 29/827 |
| 5,591,941 A | * | 1/1997 | Acocella et al. ........ | 174/266 |
| 5,633,533 A | * | 5/1997 | Andros et al. .......... | 257/707 |
| 5,878,943 A | * | 3/1999 | Nishikawa et al. ...... | 228/205 |
| 5,908,317 A | * | 6/1999 | Heo .................... | 438/617 |
| 6,168,972 B1 | * | 1/2001 | Wang et al. ............ | 438/108 |
| 6,330,967 B1 | * | 12/2001 | Milewski et al. ....... | 228/180.22 |
| 6,333,206 B1 | * | 12/2001 | Ito et al. .............. | 438/106 |
| 6,469,393 B1 | * | 10/2002 | Oya .................... | 257/779 |

* cited by examiner

Primary Examiner—Eddie Lee
Assistant Examiner—Junghwa Im
(74) Attorney, Agent, or Firm—Sonnenschein Nath & Rosenthal LLP

(57) ABSTRACT

A process of production of a semiconductor apparatus which can suppress a rise in the electrical resistance and a decline in the joint strength at the bump connection interfaces and improve the connection reliability when using the method of reinforcing the bases of the bumps by a resin film. Bumps are formed on a semiconductor wafer formed with a pattern circuit of a semiconductor chip so as to connect to the circuit pattern, a resin film is formed on the bump forming surface of the semiconductor wafer to a thickness giving a surface lower than the height of the bumps while sealing the spaces between the bumps, plasma cleaning etc., is used to remove the sealing resin components deposited on the surface portions of the bumps or natural oxides or other insulating impurities to clean and activate the surfaces of the bumps, and the chip is mounted on a mounting board.

10 Claims, 12 Drawing Sheets

SEMICONDUCTOR APPARATUS AND PROCESS OF PRODUCTION THEREOF

RELATED APPLICATION DATA

This application is a divisional application Ser. No. 09/385,959 filed Aug. 30, 1999. The present and foregoing application claims priority to Japanese Application No. P10-247393 filed Sep. 1, 1998 and Application No: P11-146942 filed May 26, 1999. All of the foregoing applications are incorporated herein by reference to the extent permitted by law.

BACKGROUND OF THE INVENTION

1. Field of the Invention

The present invention relates to a semiconductor apparatus mounted using solder or other metal bumps and a process of production of the same.

2. Description of the Related Art

In recent years, digital video cameras, digital cellular phones, notebook-type personal computers, and other portable electronic equipment have spread widely. There are mounting demands for reducing the size, reducing the thickness, and reducing the weight of these portable electronic equipment.

To realize this reduction in size, reduction in thickness, and reduction in weight of portable electronic equipment, the most important issue is the improvement of the mounting density of the components.

In particular, even in semiconductor ICs and other semiconductor devices, high density mounting technology using flip-chip-type semiconductor devices instead of the package-type semiconductor devices of the related art is being developed and put into practical use.

In the past, as the form of packaging of semiconductor apparatuses, use has been made of DIP (Dual Inline Package) or PGA (Pin Grid Array) and other through hole mounted devices (THD) mounted to printed circuit boards by inserting leads through holes provided there and QFP (Quad Flat (L-Leaded) Package) or TCP (Tape Carrier Package) or other surface mounted devices (SMD) mounted by soldering leads to the surfaces of the boards.

To further reduce sizes, attention has focused on the method of mounting a semiconductor chip with its pad opening surface facing the mounting board by a package called a chip size package (CSP, also called a FBGA (Fine-Pitch BGA)) for realizing further smaller sizes and higher densities to bring the package size extremely close to the size of the semiconductor chip (flip-chip mounting). Active research has been conducted up until now and numerous proposals have been made.

One of the mounting methods for mounting such a flip-chip type semiconductor device (flip-chip mounting) is for example the method of forming for example spherically shaped (ball shaped) solder bumps (solder ball bumps) on electrode pads comprised of aluminum (Al) etc. of a semiconductor IC and bringing the connection terminals of the semiconductor IC into contact with the solder ball bumps to directly mount the IC chip on a printed circuit board.

A semiconductor apparatus comprised of a CSP type semiconductor chip mounted on a mounting board will be explained with reference to the drawings.

FIG. 11 is a sectional view of the above semiconductor apparatus.

The surface of the semiconductor device (semiconductor wafer) 10 on which electrode pads 11 comprised of Al etc. are formed is covered for example by a first surface protective film 12 comprised of a silicon nitride layer and a second surface protective film 13 comprised of a polyimide layer in a state leaving only the electrode pad 11 portions open. Further, a conductive film 14 comprised of a stacked films of chrome (Cr), copper (Cu), gold (Au), etc. is formed at the openings of the electrode pad 11 portions to be connected to the electrode pads 11. The conductive film is sometimes called a BLM (Ball Limiting Metal) film.

Further, solder bumps 16b comprised of for example high melting point solder balls are formed connected to the conductive film (BLM film) 14.

A CSP type semiconductor chip 1 is constituted in this way.

On the other hand, the mounting board 2 is a board 20 comprised of for example a glass epoxy-based material on the top of which are provided lands (electrodes) 21 formed at positions corresponding to the positions of formation of the solder bumps 16b of the semiconductor chip 1 to be mounted and comprised of copper etc. and a not shown printed circuit connected to the lands 21 and formed on the front surface or back surface or the two surfaces of the board 20. The surface of the board 20 other than the land 21 portions is covered by a solder resist 23.

The above CSP type semiconductor chip 1 is mounted on the mounting board 2 with the bumps 16b aligned with the lands 21. The bumps 16b and lands 21 are mechanically and electrically connected by eutectic solder layers 19.

Further, the space between the CSP type semiconductor chip 1 and mounting board 2 is sealed by a sealing resin 3 comprised of an epoxy resin etc.

In the above semiconductor apparatus, as the method of forming the bumps at predetermined positions, for example there is known the method of using electrolytic plating. In this case, there is the disadvantage that the thickness of the solder bumps formed is affected by the surface conditions of the layer of material forming the underlayer of the bumps or the slight variation in the electrical resistance and that the formation of uniform solder bumps of the same height in a semiconductor chip is extremely difficult.

Therefore, a method is being developed for formation of solder ball bumps with a uniform height using formation of a solder film by vacuum deposition and lift-off of the photoresist layer.

This method will be explained below with reference to the drawings.

First, as shown in FIG. 12A, electrode pads 11 comprised of an aluminum (Al) and copper (Cu) alloy etc. are formed by patterning on a semiconductor wafer 10 formed with circuit patterns of semiconductor chips by for example the sputtering method or etching etc. and a surface protective film 13 comprised of for example a silicon nitride layer or polyimide layer etc. is formed on top of it covering the entire surface.

The electrode pad 11 portions of the surface protective layer 13 are opened, then for example a pattern is formed by the sputtering method so as to connect a conductive layer (BLM layer) 14 comprised of a stacked film of chrome, copper, and gold to the electrode pads 11.

Next, as shown in FIG. 12B, a resist film R2 having pattern openings P is formed by patterning at the conductive film (BLM film) 14 forming areas by a photolithography step.

Next, as shown in FIG. 12C, solder layers 16 are formed in the pattern openings P of the resist film R2 by forming a solder layer over the entire surface by for example a vacuum evaporation method. At this time, solder layers 16a are formed over the resist film R2 as well.

Next, as shown in FIG. 13A, the solder layers 16a formed over the resist film R2 are simultaneously removed by removing the resist film R2 by lift-off. Due to this, it is possible to leave only the solder layers 16 formed in the pattern openings P of the resist film R2.

Next, as shown in FIG. 13B, heat treatment is performed to make the solder layers 16 melt. These are cooled and solidified in a state forming spheres due to the surface tension so as to form solder ball bumps 16b.

As explained above, the solder ball bumps 16b are formed in the semiconductor wafer state (that is, the state before being cut into individual semiconductor chips).

The semiconductor wafer formed with the solder ball bumps 16b in this way is cut by dicing etc. into individual semiconductor chips, then as shown in FIG. 11, the solder ball bumps 16b are made to abut against the lands 21 comprised of Cu etc. formed on the board 20 of the mounting board 2.

Here, the board 20 is covered by a solder resist 23 over its entire front surface except for the lands 21 and is precoated by a eutectic solder layer 19 over the areas of the lands 21 or the surfaces of the solder ball bumps 16b.

Therefore, using a reflow step, the eutectic solder 19 is melted and the melted eutectic solder enters between the solder ball bumps 16b and lands 21. By cooling and hardening it, the solder ball bumps 16b are soldered and electrically connected to the lands 21.

The thermal stress becomes a major disadvantage for the reliability of the joint by the bumps after flip-chip mounting due to the differences in the coefficients of heat expansion of the semiconductor chips and the mounting board (printed circuit board).

While the coefficient of heat expansion of silicon is 3.4 ppm/° C., the coefficient of heat expansion of the generally widely used glass epoxy-based mounting board is a large about 15 ppm/° C. When thermal stress is repeatedly applied to bump joints by the temperature difference caused by the on/off operation of a chip, cracks are caused in the joints and breakage or malfunctions are caused in some cases.

To deal with the above disadvantage, as shown in FIG. 11, the method is generally adopted of injecting a sealing resin 3 between the semiconductor chips 1 and mounting board 2 and relieving the thermal stress applied to the weak strength bump joints by having the stress of heat expansion received by the sealing resin as a whole.

In the above flip-chip mounting method of the related art, however, since the semiconductor chips and the mounting board are secured by a sealing resin, when a defect occurs in a device chip, the only method was to discard the entire mounting board 2 on which that semiconductor chip 1 was mounted or apply a chemical or mechanical external force to forcibly tear off that semiconductor chip.

Here, the replacement of the entire mounting board 2 of the former case has the disadvantage of the cost ending up higher, while the forcibly tearing off of the semiconductor chip 1 of the latter case ends up damaging the mounting board 2.

Therefore, the work of replacing a defective component in the case of a defect occurring in a semiconductor chip 1, that is, the so-called rework, is difficult. This has become one factor behind the failure of flip-chip mounting from spreading widely.

Further, along with the reduction of pitch accompanying the reduction of size of semiconductor devices, at the time of injection of the sealing resin, the circulation of the sealing resin 3 becomes poor and full injection of the sealing resin 3 can no longer be achieved, so there is also the disadvantage that the thermal stress cannot be sufficiently relieved.

SUMMARY OF THE INVENTION

An object of the present invention is to provide a semiconductor apparatus and a process of production thereof which enable the thermal stress between a semiconductor device and mounting board to be reliably relieved without the use of a sealing resin and further which can reduce the connection resistance and can increase the strength of the joint portions.

According to a first aspect of the present invention, there is provided a semiconductor apparatus comprising metal bumps formed so as to connect to a circuit pattern of a semiconductor device and a resin film formed on a circuit pattern forming surface of said semiconductor device so as to seal spaces between the metal bumps and become thinner than the height of the metal bumps, the surfaces of the metal bumps projecting out from the resin film being cleaned.

Further, in the first aspect of the present invention, the surfaces of the metal bumps projecting out from the resin film are cleaned of components inviting a rise of a connection resistance and a drop in a joint strength at least at connection interfaces.

Further, in the first aspect of the present invention, said metal bumps are solder bumps and solder layers different in composition from said solder bumps are formed at the surfaces of the solder bumps projecting out from the resin film.

Further, in the first aspect of present invention, said solder bumps are comprised of a high metal point solder and said solder layers are comprised of a eutectic solder.

According to a second aspect of the present invention, there is provided a process of production of a semiconductor apparatus comprising a first step of forming metal bumps so as to connect to a circuit pattern of a semiconductor device, a second step of forming a resin film on a circuit pattern forming surface of the semiconductor device so as to seal spaces between the metal spaces and to become thinner than a height of the metal bumps, and a third step of cleaning the surfaces of the metal bumps projecting out from the resin film.

Further, in the second aspect of the present invention, in said third step, the surfaces are cleaned by removing components inviting a rise in a connection resistance and a decline in a joint strength at least at a connection interface.

Further, in the second aspect of the present invention, in the third step, the surfaces of the bumps are activated in parallel to the cleaning of the surfaces of the bumps.

Further, in the second aspect of the present invention, in the third step, the resin film components deposited on the bumps are removed.

Further, in the second aspect of the present invention, in the third step, oxides on the bump surfaces are removed.

Further, in the second aspect of the present invention, in the third step, the cleaning of the surfaces of the bumps is performed by plasma cleaning.

Further, in the second aspect of the present invention, the plasma cleaning is at least sputter etching by discharge plasma of an inert gas.

Preferably, the plasma cleaning is at least oxygen plasma treatment and then sputter etching by discharge plasma of an inert gas.

Preferably, the plasma cleaning is at least oxygen plasma treatment and then sputter etching by discharge plasma of a reducing gas.

Further, in the second aspect of the present invention, in said third step, the cleaning of the surfaces of the bumps is performed by irradiating a laser beam.

Further, in the second aspect of the present invention, in the third step, the cleaning of the surfaces of the bumps is performed under a reduced pressure atmosphere, an inert gas atmosphere, or a reducing gas atmosphere.

Further, in the second aspect of the present invention, in the third step, the cleaning of the surfaces of the bumps is performed while applying a gas jet to the bumps to peel off the unnecessary components which are then sucked away.

Further, in the second aspect of the present invention, preferably the metal bumps formed in the first step are solder bumps and, after the third step, further there is provided a fourth step of forming solder layers different in composition from the solder bumps on the surfaces of the solder bumps.

Further, preferably, the solder bumps are a high melting point solder and said solder layers are comprised of a eutectic solder.

Further, preferably, in the fourth step, the eutectic solder layers are formed by a printing method, plating method, or transfer method.

Further, in the second aspect of the present invention, the steps up to at least the third step are performed on a semiconductor device formed on a semiconductor substrate in a semiconductor wafer state.

Further, in the second aspect of the present invention, after the third step, further there is provided a fourth step of cutting the semiconductor wafer into unit semiconductor chips.

Further, in the second aspect of the present invention, after the step of cutting the semiconductor wafer into unit semiconductor chips, further there is provided a step of mounting a semiconductor chip on a mounting board from the bump forming surface side so as to connect it at the bumps.

According to the present invention, the areas around the bases of the relatively weak strength metal bumps, for example, the areas around the spherical solder bumps, are reinforced by a resin. The thermal stress is relieved by this resin.

Further, since the resin film is formed before the semiconductor device is mounted on the mounting board, so there is no need to inject the sealing resin between the mounting board and semiconductor device after mounting the semiconductor device and therefore the productivity is improved.

Further, since the resin film is formed with a height lower than the height of the metal bumps, even if the semiconductor device is mounted on the mounting board, it will not contact the mounting board.

As a result, even if a defect occurs in a semiconductor device after mounting, it becomes possible to easily remove the semiconductor device from the mounting board.

Further, according to the present invention, the components inviting a rise in a connection resistance and a decline in a joint strength at least at a connection interface are removed from the surfaces of the metal bumps exposed from the resin film and the exposed surfaces are cleaned.

In this cleaning, for example, the resin film components deposited on the bumps or the oxides at the surfaces of the bumps are removed. Further, the surfaces of the bumps are activated in parallel with the cleaning of the surfaces of the bumps.

Further, the surfaces of the metal bumps exposed from the resin film are cleaned by plasma cleaning. Therefore, the connection resistance is reduced and the joint strength increased when joining the metal bumps to the lands of the mounting board or to the solder layers formed at the surfaces of the bumps.

As a result, the thermal stress is relieved when mounting the semiconductor device to the mounting board, the electrical characteristics are improved and the joint strength is increased when the semiconductor device is mounted to the mounting board, and thereby mounting defects are reduced to a large extent.

Further, when the plasma cleaning is at least sputter etching by a discharge plasma of inert gas, by performing the sputter etching by RF discharge plasma using for example Ar or another inert gas, the resin remaining on the surfaces of the metal bumps is removed by the sputtering and surfaces of clean metal bumps are exposed. Further, physical ion irradiation is used to chemically activate the surface layers.

By this, the surfaces of the metal bumps are cleaned, the connection resistance at the time of joining them is reduced, and the joint strength is increased, so the electrical characteristics when mounting a semiconductor device are improved.

Further, when the above-mentioned plasma cleaning is at least oxygen plasma treatment followed by sputter etching by discharge plasma of an inert gas, first oxygen plasma is used to burn off the resin remaining on the surfaces of the metal bumps by a reaction system comprised mainly of a combustion reaction of the organic matter mainly comprising the resin and then using RF discharge plasma using Ar or another inert gas for sputter etching and removal of the resin remaining on the surfaces of the metal bumps by sputtering.

In this case, compared with cleaning by only discharge plasma of an inert gas, two-stage plasma cleaning enables the residual resin to be effectively removed by use of a chemical reaction (combustion reaction).

Further, the slight oxide films formed on the surfaces of the metal bumps during the cleaning by the oxygen plasma treatment are removed by the Ar ions by sputtering.

Due to this, by cleaning the surfaces of the metal bumps more, the connection resistance at the time of joining is reduced more and the joint strength is increased more.

Further, when the above-mentioned plasma cleaning treatment is at least oxygen plasma treatment and then sputter etching by discharge plasma of a reducing gas, first oxygen plasma is used to burn off the resin remaining on the surfaces of the metal bumps, then HF or another reducing gas is used for sputter etching to more thoroughly remove the resin remaining on the surfaces of the metal bumps.

Due to this, the surfaces of the metal bumps are cleaned more, the connection resistance at the time of joining is reduced more, and the joint strength is increased more.

Therefore, compared with the case of plasma cleaning by only discharge plasma of an inert gas or by discharge plasma by oxygen plasma and inert gas, the electrical characteristics at the time of mounting of the semiconductor device are improved more.

Further, according to the present invention, the surfaces of the metal bumps exposed from the resin film are for examined irradiated by a laser beam etc. to cause extremely rapid heat expansion at the surface layers of the bumps and peel off the sealing resin components, then a gas jet is directed there to remove the same or the energy of a laser beam is used to reduce the surface layers of the bumps and naturally remove the oxides so as to clean and activate the surfaces of the bumps.

Further, by cleaning the surfaces of the bumps under a reducing atmosphere, an inert gas atmosphere, or a reducing gas atmosphere, it is possible to suppress the progress of natural oxidation after the cleaning.

Further, preferably, in the step of cleaning the surfaces of the bumps, gas is ejected from a gas ejection nozzle placed for example near the bumps under a reduced pressure atmosphere, inert gas atmosphere, or reducing gas atmosphere and a laser beam is irradiated to remove the resin coating components while applying suction to the areas near the bumps by the suction nozzle placed near the bumps.

Further, according to the present invention, by forming on the solder bumps comprised of for example a highly elastic high melting point solder used as the metal bumps solder layers different in composition from the solder forming the solder bumps, preferably solder layers comprised of a eutectic solder to be brought into contact with the eutectic solder precoated on the connection lands of the mounting board, the thermal stress is relieved by the elastic deformation of the above high melting point solder even if thermal stress occurs caused by the difference in coefficients of heat expansion between for example the silicon chip constituting the semiconductor substrate of the semiconductor device and the mounting board.

Further, by forming the solder layers by a eutectic solder, the wettability with the eutectic solder precoated on the connection lands of the mounting board becomes excellent and reliable joining by soldering is achieved.

Further, since the surfaces of the solder bumps are cleaned by the plasma cleaning, the connection resistance is reduced and the joint strength is increased at the joint portions of the solder bumps and the solder layers.

Therefore, in the mounting of a semiconductor device to the mounting board, the thermal stress is relieved and the connection resistance is reduced and joint strength increased, whereby mounting defects are greatly reduced and the reliability of the joint portions by the metal bumps is improved.

Further, since the formation of the metal bumps and formation of the resin film and the plasma cleaning or laser beam irradiation and, in some cases, the formation of the solder layers are performed on a semiconductor device when at least three steps are performed on a semiconductor device formed on a semiconductor substrate in the semiconductor wafer state, there is no need to perform this work on the individual semiconductor devices, it is possible to perform this work on a large number of semiconductor devices at one time, and the productivity is improved more.

BRIEF DESCRIPTION OF THE DRAWINGS

These and other objects and features of the present invention will become clearer from the following description of the preferred embodiments given with reference to the accompanying drawings, in which:

FIGS. 2A to 2C give sectional views of production steps of a process of production of a semiconductor apparatus according to an embodiment, wherein FIG. 2A shows up to the step of opening the electrode pads, FIG. 2B shows up to the step of forming the conductive film (BLM film), and FIG. 2C shows up to the step of removing the conductive film on the resist film by lift-off;

FIGS. 3A to 3C show the steps after FIGS. 2A to 2C, wherein FIG. 3A shows up to the step of forming the surface protective film, FIG. 3B shows up to the step of depositing the solder layer, and FIG. 3C shows up to the step of removing the solder layer on the resist film by lift-off;

FIGS. 4A to 4C show the steps after FIGS. 3A to 3C, wherein FIG. 4A shows up to the step of forming the solder ball bumps by reflow, FIG. 4B shows up to the step of forming the resin coating, and FIG. 4C shows up to the step of cleaning the surfaces of the bumps;

FIGS. 5A and 5B show the steps after FIGS. 4A to 4C, wherein FIG. 5A shows up to the step of supplying the eutectic solder layers and FIG. 5B shows up to the step of mounting on the mounting board;

FIGS. 12A to 12C gives sectional views of production steps of a process of production of a semiconductor apparatus according to an example of the prior art, wherein FIG. 12A shows up to the step of forming a conductive film (BLM film), FIG. 12B shows up to the step of forming a resist film, and FIG. 12C shows up to the step of depositing the solder layer; and FIGS. 13A to 13B show the steps after FIGS. 12A to 12C, wherein FIG. 13A shows the step up to the removal of the solder layer on a resist film by lift-off and FIG. 13B shows up to the step of forming solder ball bumps by reflow.

DESCRIPTION OF THE PREFERRED EMBODIMENTS

Below, preferred embodiments of the present invention will be explained in detail with reference to the drawings.

Note that the embodiments given below are preferred specific examples of the present invention, so technically preferable limitations are applied to them, but the scope of the present invention is not limited so long as there is no particular express limitation of the present invention in the following description. The invention is not limited to these embodiments.

First Embodiment

Figure 1:
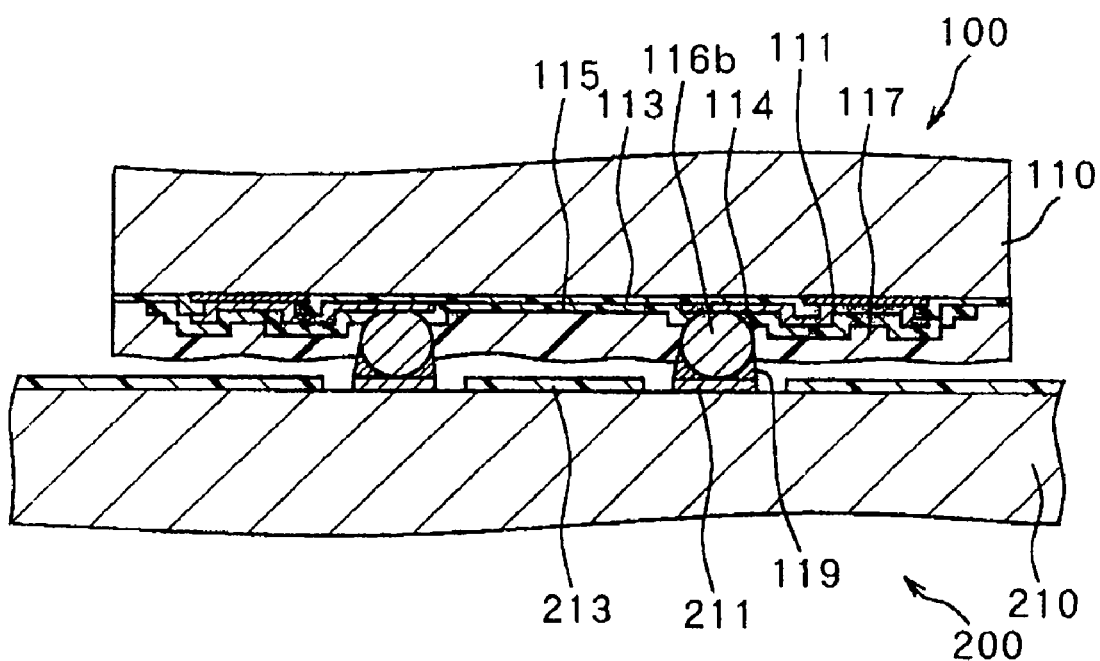
FIG. 1 is a sectional view of a semiconductor device according to an embodiment.

FIG. 1 is a sectional view of a semiconductor apparatus produced by the process of production of a semiconductor apparatus according to the present embodiment.

The surface of the semiconductor chip 110 for forming the electrode pads 111 comprised of aluminum etc. is for example covered by a surface protective film 113 comprised of for example a silicon nitride layer or polyimide layer, then electrode pad 111 portions are opened.

A conductive film 114 comprised of a stacked film of chrome, copper, and gold etc. is formed at the openings connected to the electrode pads 111. The conductive film is sometimes called a BLM (Ball Limiting Metal) film. Further, an upper surface protective film 115 comprised of for example a polyimide is formed on the conductive film (BLM film) 114 and bump forming areas are opened.

In the above bump forming regions, bumps 116*b* comprised of for example high melting point solder balls are formed connected to the conductive film (BLM film) 114. Here, to avoid contact with the adjoining bumps etc., the positions of formation of the bumps 116*b* are shifted in accordance with need with respect to the positions of formation of the electrode pads 111 and the conductive film (BLM film) 114 is formed by patterning so as to correspond to the same.

The surface of the semiconductor chip 110 (in actuality, the upper surface protective film 115 etc.) at the spaces between the bumps 116*b* is sealed by a resin film 117 comprised of an epoxy resin etc.

Further, the surfaces of the bumps 116*b* exposed from the resin coating 117 are cleaned for example by plasma cleaning.

A CSP type semiconductor chip 100 is constituted in this way.

On the other hand, the mounting board 200 is a board 210 comprised of for example a glass epoxy based material on the top of which are provided lands (electrodes) 211 formed at positions corresponding to the positions of formation of the solder bumps 116*b* of the semiconductor chip 100 to be mounted and comprised of copper etc. and a not shown printed circuit connected to the lands 211 and formed on the front surface or back surface or the two surfaces of the board 210. The surface of the board 210 other than the land 211 portions is covered by a solder resist 213.

The above CSP type semiconductor chip 100 is mounted on a mounting board 200 with the bumps 116*b* aligned with the lands 211. The bumps 116*b* and lands 211 are mechanically and electrically connected by eutectic solder layers 119.

The process of production of the above semiconductor apparatus will be explained next with reference to the drawings.

Figure 2A:
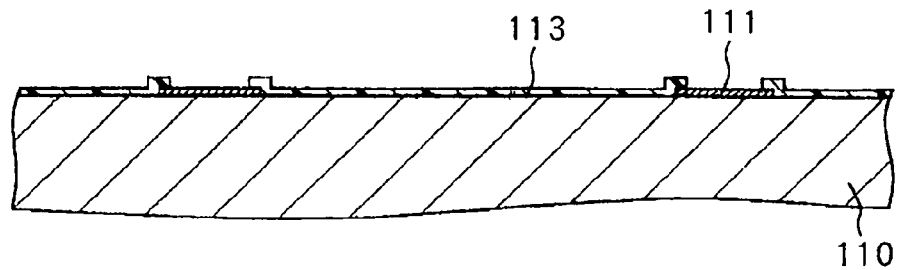

First, as shown in FIG. 2A, electrode pads 111 comprised of an aluminum and copper alloy etc. are formed by patterning on a semiconductor wafer 110 formed with circuit patterns of semiconductor chips by for example the sputtering method or etching etc., a surface protective film 113 comprised of for example a silicon nitride layer or polyimide layer etc. is formed on top of it covering the entire surface, and electrode pad 111 portions of the surface protective layer 113 are opened.

Figure 2B:
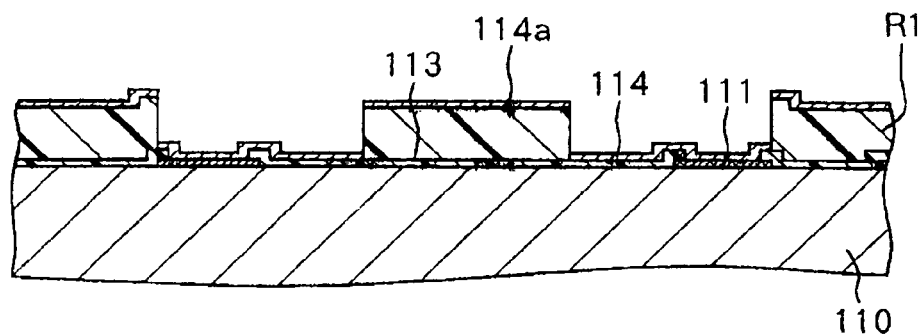

Next, as shown in FIG. 2B, a resist film R1 in which are opened regions for forming a conductive film connecting the electrode pads 111 and bumps formed in a later step are formed by patterning by a photolithography step and a stacked film of chrome, copper, and gold is deposited on the entire surface by for example the sputtering method to form a conductive film (BLM film) 114 so as to connect the electrode pads 111 in the pattern openings of the resist film R1. At this time, a conductive film 114*a* is formed on top of the resist film R1.

Figure 2C:
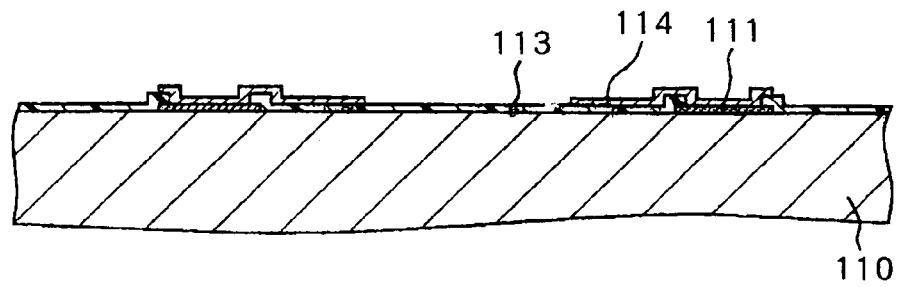

Next, as shown in FIG. 2C, the resist film R is removed by lift-off to simultaneously remove the conductive film 114*a* formed on the resist film R1. Due to this, it is possible to leave only the conductive film (BLM film) formed in the pattern openings of the resist film R1.

Figure 3A:
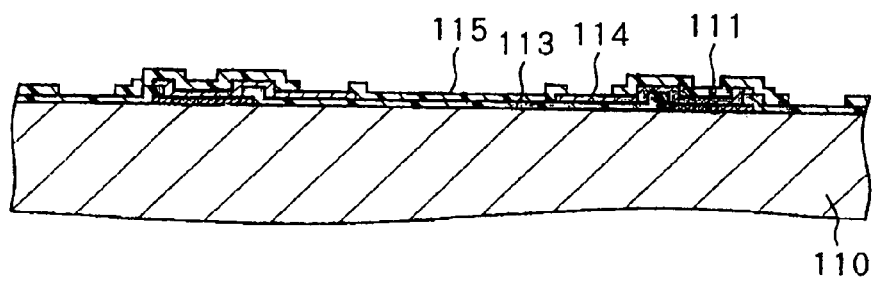

Next, as shown in FIG. 3A, an upper surface protective film 115 comprised of for example a polyimide layer etc. is formed on the conductive film (BLM film) 114 covering the entire surface and bump forming regions of the upper surface protective film 115.

Figure 3B:
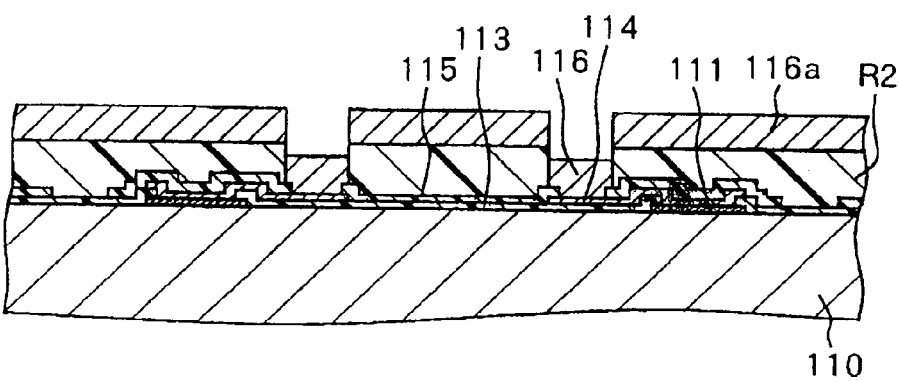

Next, as shown in FIG. 3B, a resist film R2 having pattern openings is formed by patterning at the bump forming regions by a photolithography step.

Next, a solder layer is formed over the entire surface by for example a vacuum evaporation method so as to form solder layers 116 in the pattern openings of the resist film R2. At this time, solder layers 116*a* are formed over the resist film R2 as well.

Figure 3C:
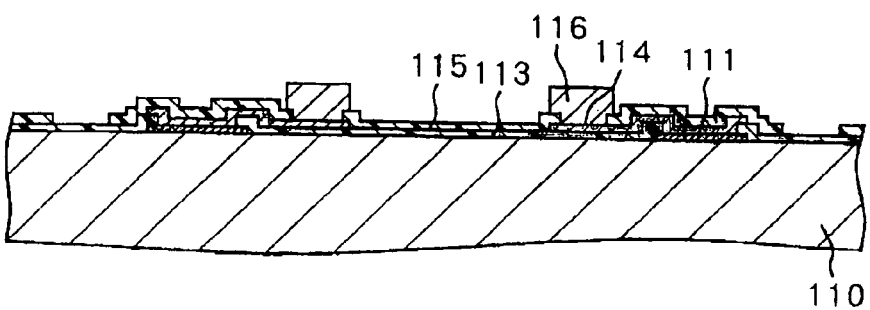

Next, as shown in FIG. 3C, the solder layers 116*a* formed over the resist film R2 are simultaneously removed by removing the resist film R2 by lift-off. Due to this, it is possible to leave only the solder layers 116 formed in the pattern openings of the resist film R2.

Figure 4A:
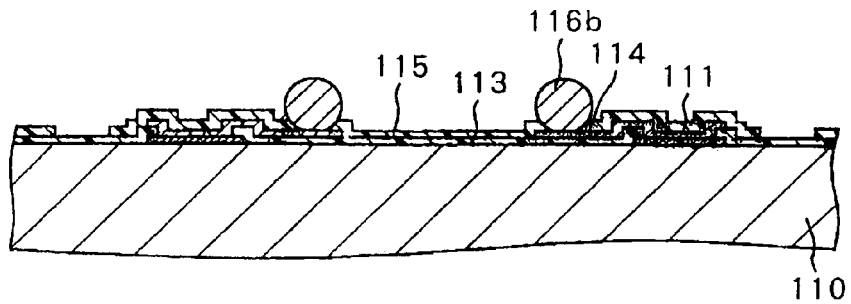

Next, as shown in FIG. 4A, heat treatment is performed to make the solder layers 116 melt. These are cooled and solidified in a state forming spheres due to the surface tension so as to form solder ball bumps 116*b* comprised of high melting point solder balls.

Note that as the solder, a high melting point solder is used. The high melting point solder is comprised of for example 97 percent or so of Pb and 3 percent or so of Sn. It has a high melting point and a relatively high elasticity.

Figure 4B:
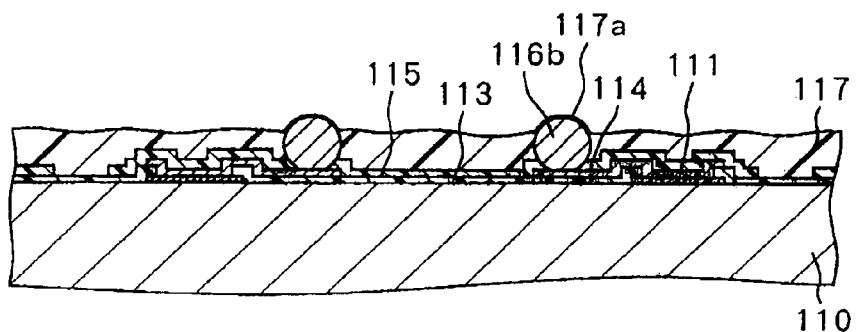

Next, as shown in FIG. 4B, an epoxy-based resin is coated by a spin coat etc. at the semiconductor wafer level, then the resin is treated to cure, for example, is heat treated by curing at about 150° C. for about 5 hours so as to cure the resin 117.

Due to this, a resin film 117 is formed at the bumps 116*b* of the semiconductor wafer 110 at a thickness forming a surface lower than the height of the bumps 116*b* while sealing the spaces between the bumps 116*b*.

At this time, resin coating components or oxides of the solder and other insulating impurities 117*a* are formed on the surfaces of the bumps 116*b* depending on the process conditions of the resin coating step. In the drawings, for convenience, a thickness greater than the actual insulating impurities is shown.

Figure 4C:
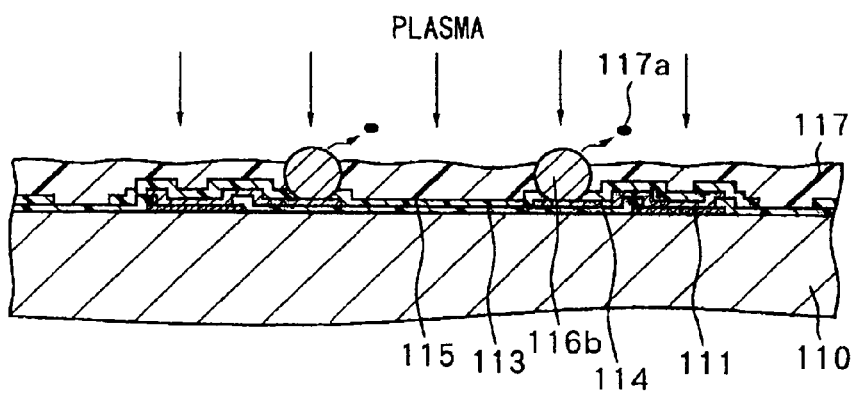

Next, as shown in FIG. 4C, plasma cleaning is used to remove the resin coating components or oxides of the solder and other insulating impurities 117*a* from the surfaces of the bumps 116*b* to clean the surfaces of the bumps 116*b* projecting out from the surface of the resin film 117.

Here, the plasma cleaning is performed as explained later by the plasma treatment device shown in FIG. 6 or FIG. 7 for example. By this, the surfaces of the bumps 116*b* are sputter etched and the resin coating components or oxides of the solder or other insulating impurities 117*a* remaining at the surfaces are removed.

Figure 5A:
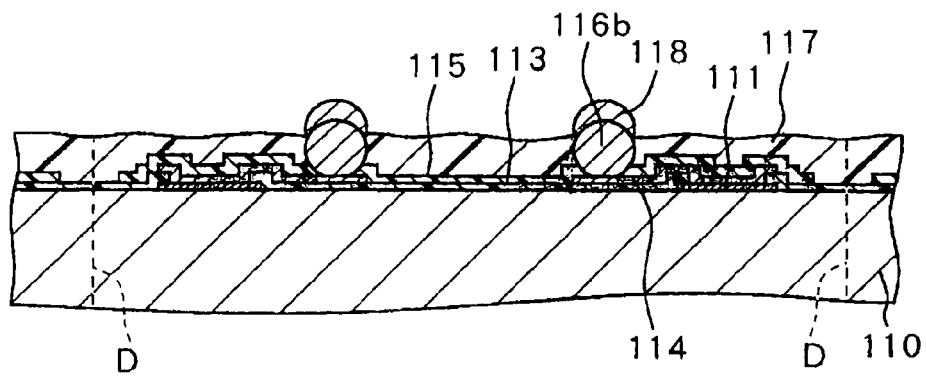

Next, as shown in FIG. 5A, eutectic solder layers 118 are formed by the printing method, plating method, or transfer method connected to the bumps 116*b*. By forming the eutectic solder layers 118, the height of the bumps is increased and the resistance to thermal stress is improved, the wettability with the solder at the time of mounting to the mounting board can be improved, and the reliability of the connections can be further improved.

Next, the semiconductor wafer 110 is cut along the cutting positions D of the semiconductor wafer 110 by a dicing step to divide it into individual CSP type semiconductor chips 100.

Note that the above eutectic solder is comprised of for example 40 percent or so of Pb and 60 percent or so of Sn. Compared with the above-mentioned high melting point solder, it has a low melting point of for example not more than 200° C.

Heat treatment is applied at a temperature in a range where only the eutectic solder melts and the high melting point solder does not melt (for example, 200° C. to 250° C.), whereby the above eutectic solder film pattern melts and, as shown in FIG. 5A, forms balls and hardens by the surface tension so as to join with the cleaned surfaces of the bumps 116b.

Due to this, solder bumps of a stacked structure of the bumps 116b and eutectic solder 118 are formed.

Figure 5B:
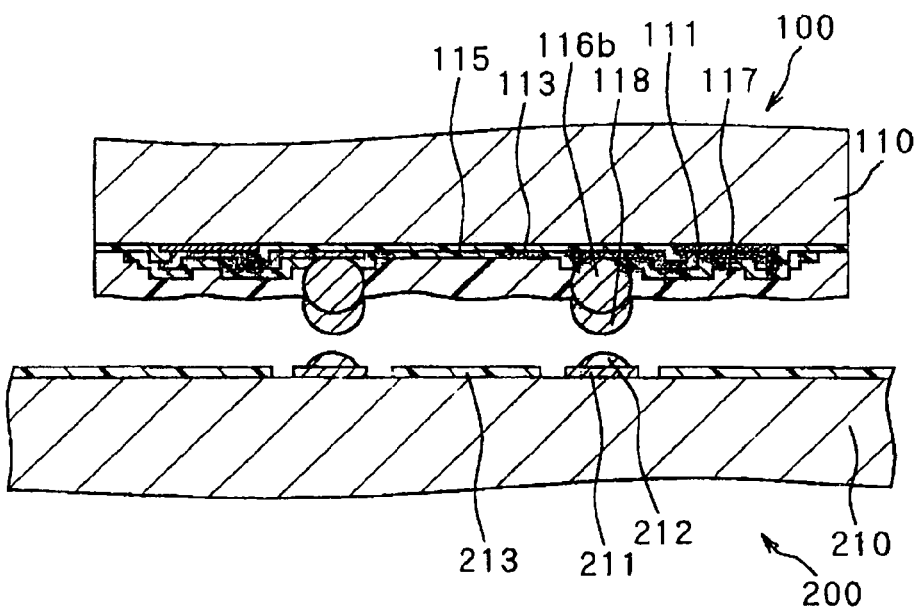

Next, as shown in FIG. 5B, the CSP type semiconductor chip 100 is mounted on a mounting board 200 from the bump 116b forming surface.

The mounting board 200 is a board 210 comprised of for example a glass epoxy based material on the top of which are provided lands (electrodes) 211 formed at positions corresponding to the positions of formation of the solder bumps 116b of the semiconductor chip 100 to be mounted and comprised of copper etc. and a not shown printed circuit connected to the lands 211 and formed on the front surface or back surface or the two surfaces of the board 210.

A precoated solder layer 212 comprised of a eutectic solder is formed on the lands 211. Further, the surface of the board 210 other than the land 211 portions is covered by a solder resist 213.

The above CSP type semiconductor chip 100 is mounted on the above mounting board 200 with the bumps 116b aligned with the lands 211. Heat treatment of for example 200 to 250° C. is used to make the eutectic solder layer 118 or precoated solder layer 212 reflow without the bumps 116b melting, eutectic solder layers 119 are formed at the joint positions of the bumps 116b and lands 211, and the CSP type semiconductor chip 100 and mounting board 200 are mechanically and electrically connected to produce the semiconductor device shown in FIG. 1.

In this case, since the eutectic solder 118 comprises a eutectic solder film, the wettability of the eutectic solder 118 and the eutectic solder film 212 prepared on the lands 211 is excellent. Therefore, the eutectic solder 118 and the lands 211 join strongly with each other due to their close affinity, so the soldering is reliable.

Next, two examples of the above-mentioned plasma cleaning will be explained with reference to FIG. 6 and FIG. 7.

Figure 6:
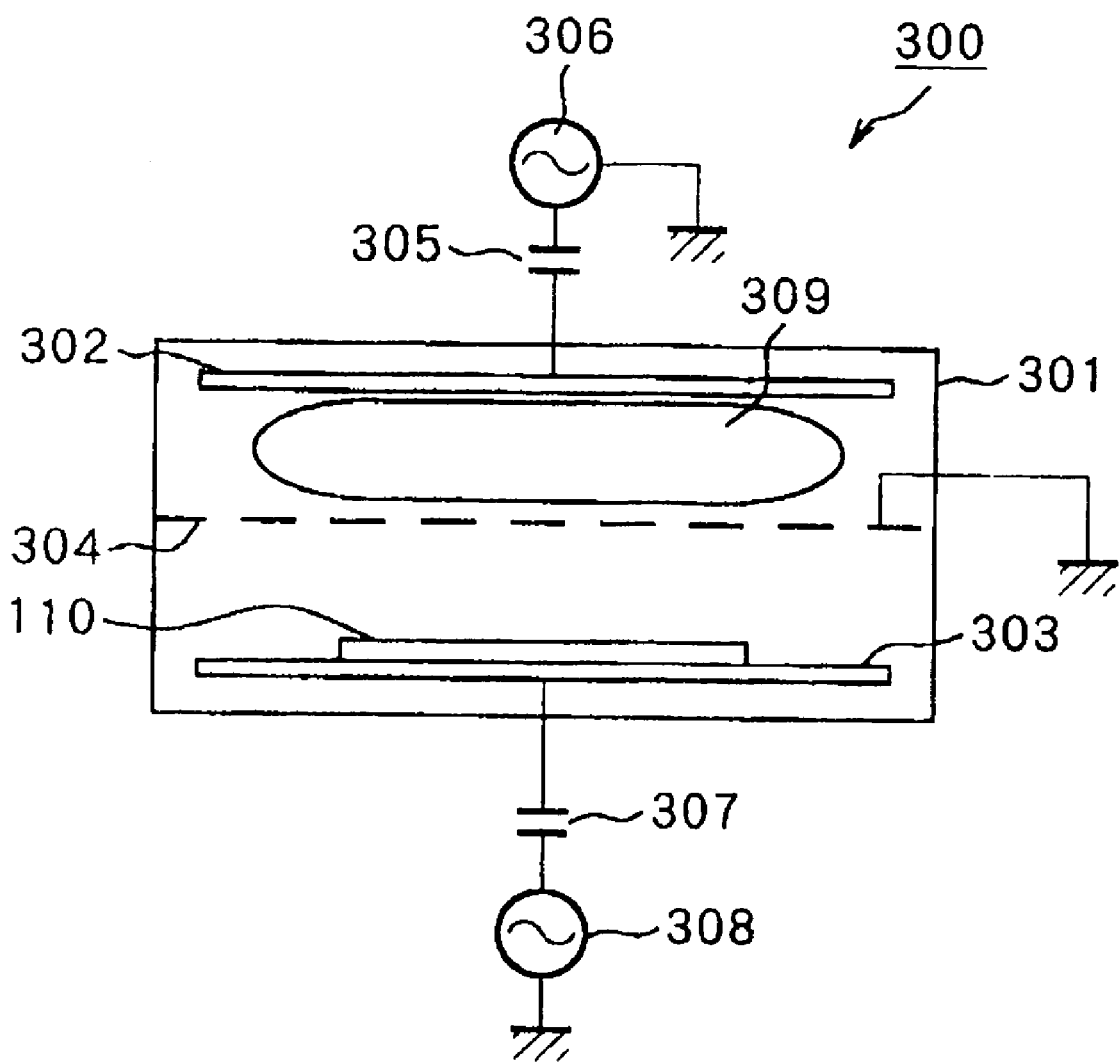
FIG. 6 is a schematic sectional view of a first example of the configuration of a plasma treatment device for plasma cleaning in the process of production of FIG. 1.

First, in a first embodiment of the plasma cleaning, the plasma treatment device shown in FIG. 6 is used for plasma cleaning by a discharge plasma of an inert gas, for example, argon gas.

In FIG. 6, the plasma treatment device 300 is a so-called triode type RF plasma treatment device comprised of a sealed plasma treatment chamber 301, an anode plate 302 provided at the top inside the plasma treatment chamber 301, a stage 303 serving as a cathode plate provided at the bottom, a lattice electrode 304 provided between the anode plate 302 and the stage 303, a coupling capacitor 305 through which a plasma generation power source 306 is connected to the cathode plate 302, and a coupling capacitor 307 through which a substrate bias power source 308 is connected to the stage 303.

According to the plasma treatment device 300 of this configuration, a treated substrate, that is, the semiconductor wafer 110, is placed on the stage 303, a bias voltage is applied between the stage 303 and lattice electrode 304 by the substrate bias power source 308 in the state with for example an argon gas introduced inside as an inert gas, and the plasma generation power source 306 is used to apply a plasma source power between the anode plate 302 and the lattice electrode 304.

Due to this, a discharge plasma 309 of argon gas is produced between the anode plate 302 and the lattice electrode 304, and argon ions Ar+ fly out from the anode plate 302 toward the lattice electrode 304, pass through the lattice electrode 304, and strike the semiconductor wafer 110 on the stage 302.

Therefore, due to the sputtering action, the surface of the semiconductor wafer 110, that is, the surface of the resin 117 and the projecting surfaces of the bumps 116b are etched, whereby the resin 117a remaining on the surfaces of the bumps 116b is removed.

In this case, the operating conditions of the above plasma treatment device 300 are set as shown below for example. That is, Flow rate of argon gas: 25 sccm
Temperature of stage 303: Room temperature
Plasma source power: 700W (2 MHZ)
Substrate bias voltage: 350V (13.56 MHZ)
Treatment time: 120 seconds When the plasma cleaning of the semiconductor wafer 110 was performed by these operating conditions, due to the sputtering action of the Ar+ ions, the resin 117a remaining on the surfaces of the bumps 116b was effectively removed and the surfaces of the bumps 116b were cleaned.

Next, an explanation will be made of a second example of the plasma cleaning.

Figure 7:
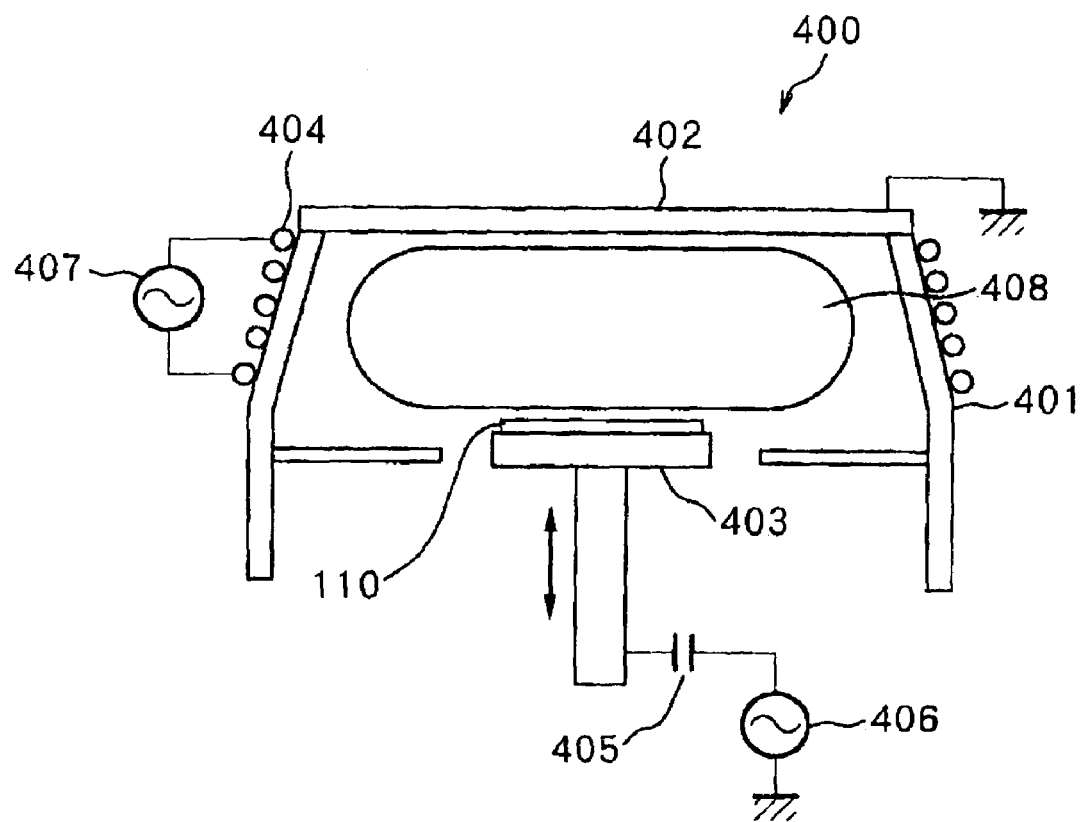
FIG. 7 is a schematic sectional view of a second example of the configuration of a plasma treatment device for plasma cleaning in the process of production of FIG. 1.

In the second example, the plasma treatment device shown in FIG. 7 was used for oxygen plasma treatment, then discharge plasma of a reducing gas was used for plasma cleaning.

In FIG. 7, the plasma treatment device 400 is an ICP (Inductively Coupled Plasma) high density plasma treatment device of a known configuration comprised of a sealed plasma treatment chamber 401, an anode plate 402 provided at the top inside the plasma treatment chamber 401, a vertically movable stage 403 serving as a cathode plate provided at the bottom, an inductively coupled coil 404 provided around the plasma treatment chamber 401, a coupling capacitor 405 through which a substrate bias power source 406 is connected to the stage 403, and an ICP power source 407 connected to the inductively coupled coil 404.

According to the plasma treatment device 400 of this configuration, a treated substrate, that is, the semiconductor wafer 110, is placed on the stage 403, a bias voltage is applied between the stage 403 and anode electrode 402 by the substrate bias power source 406 in the state with oxygen gas introduced inside, and a high frequency induction field is produced inside the plasma treatment chamber 401.

Due to this, the electrons inside the plasma treatment chamber 401 are accelerated, a high density oxygen plasma 408 is produced, and oxygen ions strike the semiconductor wafer 110 on the stage 403.

Therefore, due to the plasma ashing action, the surface of the semiconductor wafer 110, that is, the surface of the resin 117 and the projecting surfaces of the bumps 116b, are etched, whereby the resin coating components or oxides of the solder or other insulating impurities 117a remaining on the surfaces of the bumps 116b are removed.

In this case, the operating conditions of the above plasma treatment device 400 are set as shown below for example. That is, Flow rate of oxygen gas: 50 sccm
Pressure: 0.3 Pa
Temperature of stage 403: 90° C.
Power of ICP power source: 1000W (450 kHz)
Substrate bias voltage: 100V (13.56 MHZ)
Treatment time: 20 seconds When the plasma cleaning of the semiconductor wafer 110 is performed by these operating conditions, due to the ashing action of the oxygen plasma, the resin 117a remaining on the surfaces of the bumps 116b is effectively removed.

Note that in this case, the surfaces of the bumps 116b are slightly oxidized by the oxygen plasma and an oxide film is formed.

Next, plasma etching is performed by reducing gas to remove the oxide film of the bumps 116b.

This reducing gas plasma etching is performed in the above plasma treatment device 400 by changing the settings of the operating conditions, introducing a mixed gas of for example hydrofluoride (HF) gas as the reducing gas and for example argon gas as the inert gas inside the plasma treatment chamber 400, and etching the surfaces of the bumps 116b by the plasma etching action of the reducing gas.

In this case, the operating conditions of the above plasma treatment device 400 are set as shown below for example. That is, Flow rate of HF gas: 25 sccm
Flow rate of argon gas: 25 sccm
Pressure: 0.13 Pa
Temperature of stage 403: 90° C.
Power of ICP power source: 1000W (450 kHz)
Substrate bias voltage: 250V (13.56 MHZ)
Treatment time: 20 seconds When the plasma cleaning of the semiconductor wafer 110 is performed by these operating conditions, the oxide film formed on the surfaces of the bumps 116b is reduced by the reaction with the HF gas and the sputtering action of the Ar+ ions causes sputter removal and cleans the surfaces of the bumps 116b.

A high density plasma generation source is used by the plasma treatment device 400 and treatment in a low pressure atmosphere is enabled by this. Due to this, the ion species produced in large quantities strike the surface of the semiconductor chip 110 substantially perpendicularly without scattering and the etching by the sputtering by irradiation of Ar+ ions is performed at a high speed with good efficiency.

Therefore, even if the substrate bias voltage is set low so as to reduce the damage caused by the plasma cleaning of the semiconductor chip 110, the time required for the plasma cleaning of the surfaces of the bumps 116b is shortened without a reduction in the etching rate.

Therefore, the resin 117a remaining on the surfaces of the bumps 116b are more effectively removed by the plasma etching by the oxygen plasma and the plasma etching by the reducing gas and the surfaces are cleaned more.

Further, in the above example, hydrofluoride gas HF was used as the reducing gas, but the invention is not limited to this. For example, it is clear that it is also possible to use for example hydrogen gas $H_2$ or hydrochloride gas HCl or another reducing gas.

Here, when a liquid form of HF or HCl etc., for example bubbling using helium He or another carrier gas, heating aeration, ultrasonic aeration, or another suitable means is used to introduce it into the plasma treatment chamber 301, 401.

Further, in the above examples, a triode-type RF plasma treatment device 300 or ICP high density plasma treatment device 400 was used for the plasma cleaning of the surfaces of the bumps 116, but the invention is not limited to this. For example, it is clear that it is also possible to use a parallel plate type RF plasma treatment device or a so-called TCP, ECR, helicon wave plasma, or other type of high density plasma treatment device.

As explained above, according to the first embodiment, the bases of the bumps are reinforced by a resin film sealing the spaces between the bumps, it is possible to increase the resistance to heat expansion stress and improve the connection reliability even without completely sealing the area between the semiconductor chips and the mounting board by a resin, the detachment of a CSP type semiconductor chip from the mounting board is easy, and it is possible to simply replace defective components (rework).

Further, the bumps 116b are secured and held by the resin film 117. Even if thermal stress occurs between the semiconductor substrate and the mounting board due to changes in temperature of the surroundings etc. after mounting, since the solder bumps are secured by the resin film 117 and the bumps 116b have elasticity, the resin film 117 as a whole receives the thermal stress and the bumps 116b elastically deform so the thermal stress is relieved. Due to this, breakage of the joint portions of the solder bumps 23 by thermal stress is prevented and the reliability of the solder bumps is improved.

Further, since the resin film 117 is formed on the surface of the electrode pad 111 side of the semiconductor chip 100 before mounting to the mounting board 200, the resin film 117 never contacts the surface of the mounting board 200.

Therefore, there is no need to inject resin between the semiconductor chips 100 and the mounting board 200 as in the past, so even when reducing the pitch of semiconductor chips 100, since the sealing resin 117 reliably covers the entire surface of the semiconductor wafer, the thermal stress is reliably relieved and the durability with respect to thermal stress is improved.

Further, the bumps 116b are surrounded by the resin film 117, then the exposed surfaces projecting out from the resin film 117 are cleaned by plasma cleaning. Further, a eutectic solder 118 is formed on the cleaned surfaces, so the connection resistance at the interface of the bumps 116b and the eutectic solder 118 is reduced and the joint strength is increased.

Therefore, bumps are comprised with lower resistances and higher joint strengths and the occurrence of mounting defects is reduced more.

Therefore, according to the present embodiment, the electrical characteristics and the bonding strength at the interfaces are improved, whereby the reliability and durability of the semiconductor chip 100 and the various equipment in which it is installed are greatly improved.

In the above embodiments, the bumps 116b are covered by a film by vacuum evaporation and a pattern formed by lift-off of the photoresist, but the invention is not limited to this. It is clear that electroplating etc. may also be used to form it.

Further, in the above-mentioned embodiment, the explanation was given of the case of forming solder bumps with respect to the electrode pads 111 of a semiconductor device, but the invention is not limited to this. It is clear that the present invention may also be applied to the case of forming solder bumps with respect to other types of semiconductor devices.

Further, in the embodiment explained above, the explanation was given of the example of use, as a solder, of a high melting point solder comprised of for example 97 percent or so of Pb (lead) and 3 percent or so of Sn or a eutectic solder comprised of for example 40 percent or so of Pb and 60 percent or so of Sn, but of course it is also possible to use another solder not containing Pb, for example, a solder comprised of 96.5 percent of tin and 3.5 percent of silver, a solder comprised of 99.3 percent of tin and 0.7 percent or copper, etc.

Further, in the above embodiment, the explanation was given of the example of ball-shaped bumps comprised of solder as the bumps, but the present invention is not limited to this. For example, of course, it is also possible to use copper ball bumps, nickel ball bumps, or other types of metal bumps.

Second Embodiment

Figure 8:
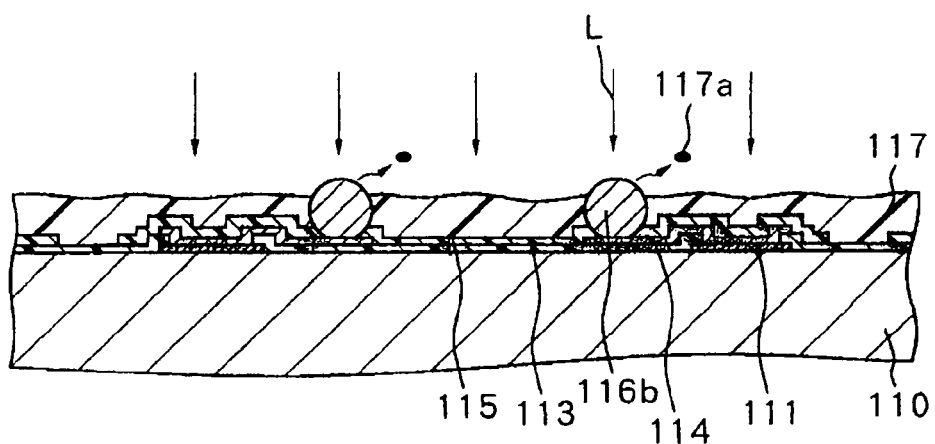
FIG. 8 is a view for explaining a second embodiment of the process of production of a semiconductor apparatus according to the present invention.

FIG. 8 is a view for explaining a second embodiment of the process of production of a semiconductor apparatus according to the present invention.

The point of difference of the second embodiment from the first embodiment explained above is that the cleaning of the surfaces of the bumps 116b exposed from the resin film 117 is performed by removing the resin film and other unnecessary components by irradiation of a laser beam L as shown in FIG. 8 instead of plasma cleaning.

The processing of the rest of the steps is performed in the same way as the first embodiment. That is, in the second embodiment, the step shown in FIG. 8 is performed instead of the step of FIG. 4C in the process of production explained with relation to FIGS. 2A, 2B, and 2C, FIGS. 3A, 3B, and 3C, FIGS. 4A, 4B, and 4C, and FIGS. 5A and 5B.

Further, since a semiconductor apparatus similar to the semiconductor apparatus shown in FIG. 1 is obtained by this process of production, a detailed explanation will be given below of the cleaning by this irradiation of a laser beam.

Specifically, a resin film 117 is formed on the surface of the semiconductor wafer 110 for forming the bumps 116b to a thickness for forming a surface lower than the height of the bumps 116b, then, as shown in FIG. 8, an excimer laser beam L is irradiated on the surface of the semiconductor wafer 110 forming the bumps 116b to remove from the surfaces of the bumps 116b the resin film components or oxides of the solder or other insulating impurities 117a and clean the surfaces of the bumps 116b projecting out from the surface of the resin film 117.

Figure 9:
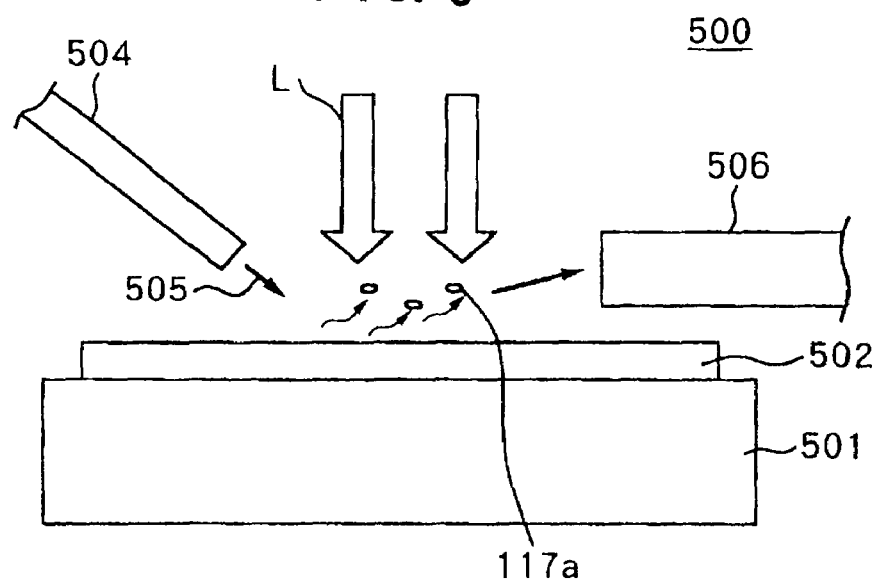
FIG. 9 is a schematic view of an excimer laser beam irradiation device according to a second embodiment.

Here, the laser beam may be irradiated from a laser beam irradiation device such as shown in the schematic view of FIG. 9 for example.

The laser beam irradiation device 500 is provided with a wafer stage 501, a not shown light source for irradiating an excimer laser beam L, a gas ejection nozzle 504 for ejecting a gas 505, and a suction nozzle 506.

In the laser beam irradiation device 500, the semiconductor wafer 502 for processing is placed on and secured to the wafer stage 501 with the bump forming surface facing upward and a KrF excimer laser beam L with for example a wavelength of 248 nm, an energy density of 400 mJ/cm$^2$, and a pulse oscillation of 30 Hz is irradiated on the bump forming surface of the semiconductor wafer to sweep it at a speed of 50 mm/sec.

At this time, the nitrogen gas or other gas 505 is ejected from the gas ejection nozzle 504 provided at the laser beam irradiation device to the bump forming surface at a flow rate of 20 l/sec to peel off the sealing resin components and other insulating impurities 117a which are then sucked away by the suction nozzle 506.

Note that the movement of the wafer stage 501 and laser pulses are synchronized and a laser beam irradiated at a constant overlap. The amount of irradiation of the laser beam is controlled to be uniform in the plane of the semiconductor wafer.

Due to the above irradiation of a laser beam, extremely sharp heat expansion is caused at the surface portions of the bumps 116b, the sealing resin components deposited on the surfaces of the bumps 116b are peeled off, and a gas jet is applied to remove them so as to clean the surfaces of the bumps. Further, the energy of the laser beam may be used to reduce the surface portions of the bumps and remove the natural oxides and activate the surfaces of the bumps.

Figure 10:
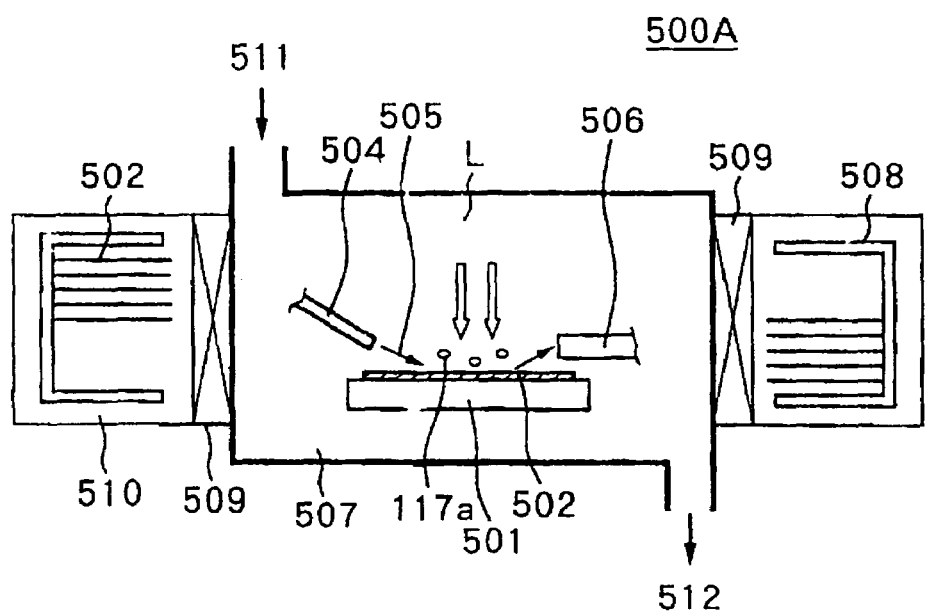
FIG. 10 is a schematic view of an excimer laser beam irradiation device according to a second embodiment.
Figure 11:
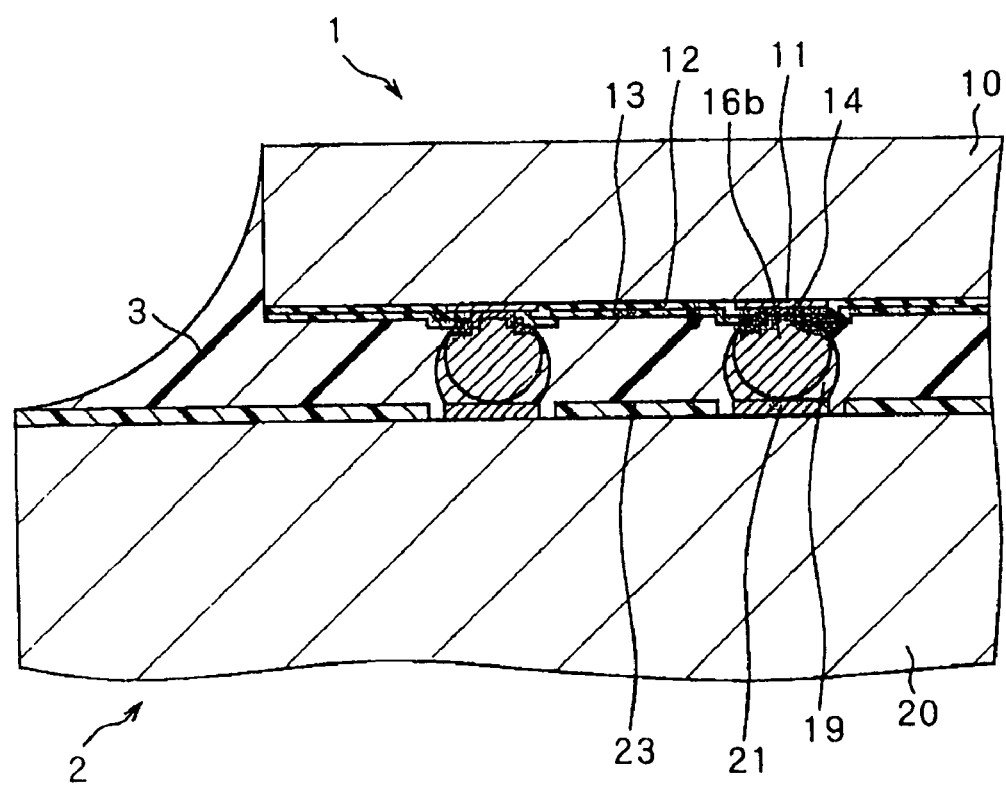
FIG. 11 is a sectional view of a semiconductor apparatus according to a prior art.
Figure 12A:
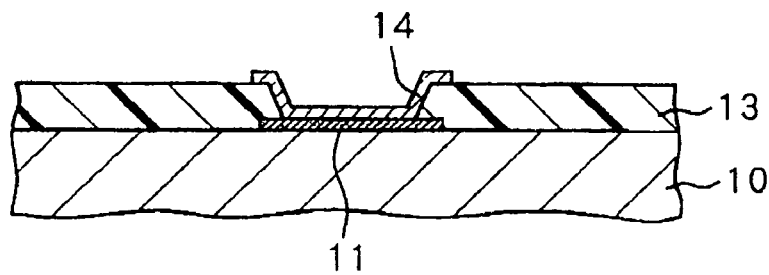
Figure 12B:
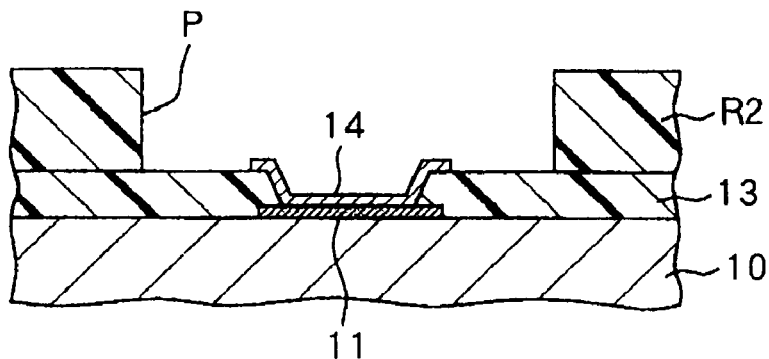
Figure 12C:
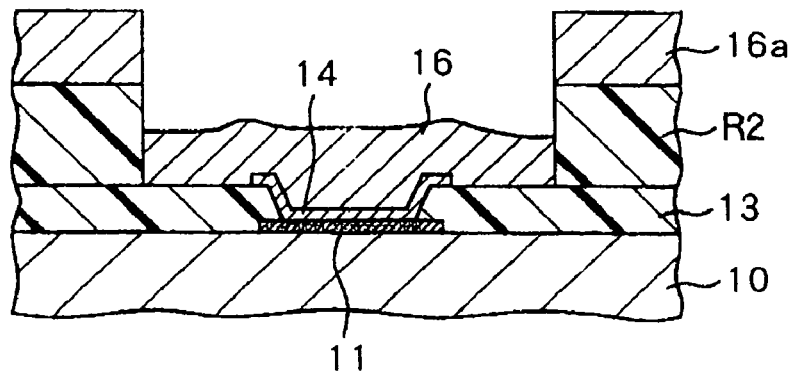
Figure 13A:
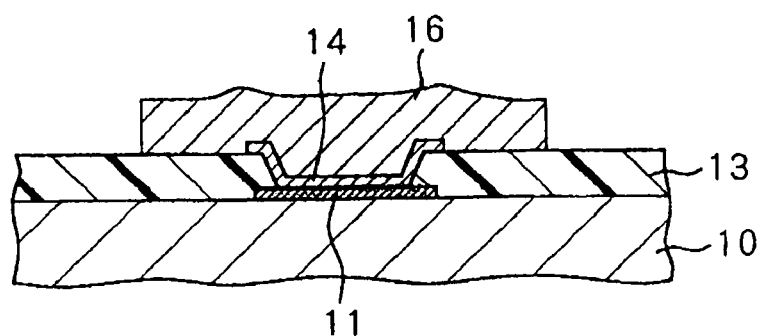
Figure 13B:
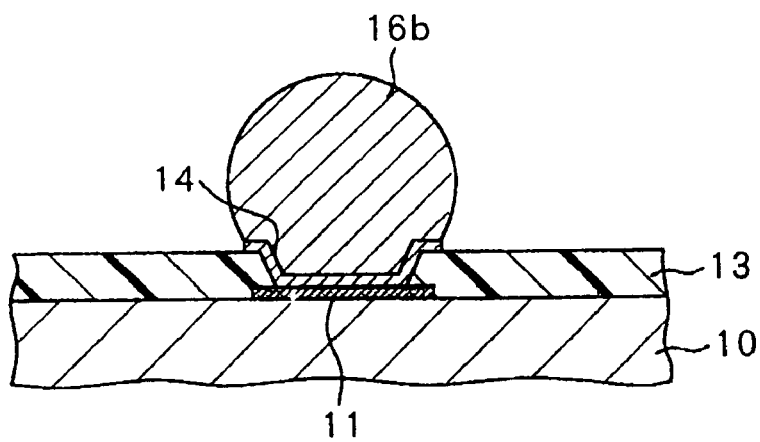

Further, the laser beam may be irradiated by a laser beam irradiation device such as shown in the schematic view of FIG. 10 for example.

The laser beam irradiation device 500A is provided with a wafer cassette 508 in which untreated wafers 502 are housed, a reaction treatment chamber 507, and a load-lock chamber 510 in which treated wafers 502 are housed. The wafer cassette 508 and reaction treatment chamber 507 and the reaction treatment chamber 507 and load-lock chamber 500 are connected by gate valves 509.

In the reaction treatment chamber 507, the laser beam irradiation device 500A is provided with a wafer stage 501, a not shown light source for irradiating the excimer laser beam L, a gas ejection nozzle 504 for ejecting a gas 505, and a suction nozzle 506.

Further, the reaction treatment chamber 507 is provided with a gas exhaust port 512 connecting the gas introduction port 511 to a not shown suction pump. The inside of the reaction treatment chamber 507 can be made a reduced pressure atmosphere, an inert gas atmosphere, or a reducing gas atmosphere.

In the above laser beam irradiation device 500A, the air is exhausted from the gas exhaust port 512 to reduce the pressure, a nitrogen gas is introduced from the gas introduction port 511, and a not shown wafer operating mechanism is used to take out a semiconductor wafer to be treated from the wafer cassette in the reaction treatment chamber 507 controlled to a 1 Torr nitrogen atmosphere and to place and secure the bump forming surface on the wafer stage 501 facing upward.

A KrF excimer laser beam L with for example a wavelength of 248 nm, an energy density of 400 mJ/cm$^2$, and a pulse oscillation of 30 Hz is irradiated on the bump forming surface of the semiconductor wafer to sweep it at a speed of 50 mm/sec.

At this time, the nitrogen gas or other gas 505 is ejected from the gas ejection nozzle 504 provided at the laser beam irradiation device to the bump forming surface at a flow rate of 20 l/sec to peel off the sealing resin components and other insulating impurities 117a which are then sucked away by the suction nozzle 506.

The treated semiconductor wafer 502 is housed in the load-lock chamber 510 by a not shown wafer operating mechanism.

Note that the movement of the wafer stage 501 and laser pulses are synchronized and a laser beam irradiated at a constant overlap. The amount of irradiation of the laser beam is controlled to be uniform in the plane of the semiconductor wafer.

Due to the above irradiation of a laser beam, the sealing resin components deposited on the surfaces of the bumps 116b are peeled off and a gas jet is applied to remove them so as to clean the surfaces of the bumps. Further, it is possible to remove the natural oxides on the surfaces of the bumps and activate the surfaces of the bumps.

Further, by performing the above treatment in a reduced pressure atmosphere, inert gas atmosphere, or reducing gas atmosphere, the oxygen is removed from the reaction treatment chamber 507. The chamber becomes a high temperature by the cleaning by irradiation of a laser beam and the progress of natural oxidation of the activated surfaces of the bumps can be suppressed.

Next, as shown in FIG. 5A, a eutectic solder layer 118 is formed connected to the bumps 116*a* by the printing method, plating method, or transfer method, then the semiconductor wafer 110 is cut along the cutting positions D of the semiconductor wafer 110 by a dicing step to divide it into individual CSP type semiconductor chips 100.

Further, as shown in FIG. 5B, a CSP type semiconductor chip 100 is mounted on the mounting board 200 from the bump 116*b* forming surface.

In the second embodiment, in the same way as the semiconductor apparatus according to the first embodiment explained above, the bases of the bumps are reinforced by the resin film sealing the spaces between the bumps. Even if the area between the semiconductor chips and the mounting board is not completely sealed by the resin, it is possible to increase the resistance to heat expansion stress and improve the connection reliability, the removal of a CSP type semiconductor chip from the mounting board is easy, and the work of replacement of defective components (rework) is simple.

Further, according to the process of production of a semiconductor apparatus of the present embodiment, irradiation by a laser beam etc. is used to cause extremely sharp heat expansion at the surface portions of the bumps to peel off the sealing resin components which are then removed by a gas jet or the energy of the laser beam is used to reduce the surface layer portions of the bumps and remove the natural oxides so as to clean and activate the surfaces of the bumps before mounting, so a rise in the electrical resistance and a decline in the joint strength at the bump joint interfaces are suppressed and the connection reliability can be improved.

Further, in the same way as the above first embodiment, as the semiconductor apparatus produced by the second embodiment, any of a MOS transistor type semiconductor apparatus, bipolar type semiconductor apparatus, BiCMOS type semiconductor apparatus, semiconductor apparatus carrying logics and memories, and other semiconductor apparatuses may be applied.

Further, the process of production of a semiconductor apparatus is not limited to the above second embodiment For example, the configuration of the laser beam treatment device, conditions of the processes, structure of the wafer, etc. are not limited to the details explained in the above embodiments.

Further, the bumps may be formed on the wafer by use of transfer of the solder balls and other various methods.

In addition, various changes may be made within the scope of the gist of the present invention.

As explained above, according to the present invention, it is possible to reliably relieve the thermal stress between a semiconductor device and mounting base without the use of a sealing resin and possible to reduce the connection resistance and increase the strength of the joint portion.

Further, according to the present invention, when using the process of reinforcing the bases of the bumps by a resin film sealing the spaces between bumps, it is possible to suppress the rise of the electrical resistance and decline of the joint strength at the bump joint interfaces and improve the connection reliability.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor apparatus comprising:
    a semiconductor chip having a circuit pattern disposed thereon;
    a plurality of solder bumps formed on said semiconductor chip and connecting to said circuit pattern, said solder bumps forming spaces therebetween;
    a resin film disposed on said semiconductor chip and directly contacting said solder bumps, said resin film being disposed in the spaces between solder bumps such that upper surfaces of said solder bumps protrude from said resin layer;
    wherein said upper surfaces of said solder bumps are cleaned of impurities;
    a eutectic solder layer disposed on said cleaned upper surfaces of said solder bumps;
    a mounting board;
    a plurality of lands formed on said mounting board and aligned opposite said solder bumps; and
    a precoated solder layer disposed on said lands;
    wherein said eutectic solder layer of said solder bumps and said precoated solder layer join said upper surfaces of said solder bumps to said lands of said mounting board such that a stacked structure is obtained;
    wherein a gap is formed between said resin layer and said mounting board of said stacked structure.

2. The semiconductor apparatus as set forth in claim 1, wherein the surfaces of the metal bumps projecting out from the resin film are cleaned of components causing a rise of a connection resistance and a drop in a joint strength at least at connection interfaces.

3. The semiconductor apparatus as set forth in claim 1, wherein said eutectic solder layer of said solder bumps and said precoated solder layer intermix to join said upper surfaces of said solder bumps to said lands of said mounting board.

4. The semiconductor apparatus as set forth in claim 1, wherein said resin film includes an epoxy-based resin film cured at about 150° C. for about 5 hours after being spin-coated in place.

5. The semiconductor apparatus as set forth in claim 1, wherein said upper surfaces of said solder bumps are plasma cleaned of impurities.

6. The semiconductor apparatus as set forth in claim 1, wherein said precoated solder layer comprises a eutectic solder.

7. The semiconductor apparatus as set forth in claim 1, wherein each of said lands has a top side, a bottom side opposite said top side and directly contacting the mounting board, and side walls extending from the top side to the bottom side.

8. The semiconductor apparatus as set forth in claim 1, wherein said mounting board includes an upper surface, the upper surface having land portions on which said lands are formed.

9. The semiconductor apparatus as set forth in claim 8, further comprising solder resists formed on the mounting board intermediate adjacent lands of the plurality of lands.

10. The semiconductor apparatus as set forth in claim 1, wherein said solder bumps are comprised of high metal point solder and said solder layers are comprised of a eutectic solder.

* * * * *